United States Patent
Hardee

(10) Patent No.: US 7,359,277 B2
(45) Date of Patent: Apr. 15, 2008

(54) HIGH SPEED POWER-GATING TECHNIQUE FOR INTEGRATED CIRCUIT DEVICES INCORPORATING A SLEEP MODE OF OPERATION

(75) Inventor: Kim C. Hardee, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 344 days.

(21) Appl. No.: 10/776,101

(22) Filed: Feb. 11, 2004

(65) Prior Publication Data

US 2005/0052936 A1    Mar. 10, 2005

Related U.S. Application Data

(60) Provisional application No. 60/500,126, filed on Sep. 4, 2003.

(51) Int. Cl.
*G11C 8/00*    (2006.01)

(52) U.S. Cl. .............. 365/230.06; 365/226; 365/227; 327/333

(58) Field of Classification Search ........... 365/230.06, 365/226, 227; 327/333, 112
See application file for complete search history.

(56) References Cited

U.S. PATENT DOCUMENTS

| | | | |
|---|---|---|---|
| 5,541,885 A * | 7/1996 | Takashima | .................. 365/226 |
| 5,814,851 A | 9/1998 | Suh | |
| 6,049,245 A | 4/2000 | Son et al. | |
| 6,072,333 A * | 6/2000 | Tsukagoshi et al. | .......... 326/58 |
| 6,100,563 A * | 8/2000 | Arimoto | .................... 257/347 |
| 6,208,171 B1 | 3/2001 | Kumagai et al. | |
| 6,208,575 B1 | 3/2001 | Proebsting | |
| 6,275,432 B1 | 8/2001 | Hardee | |
| 6,307,408 B1 * | 10/2001 | Shamlou et al. | ............ 327/112 |
| 6,424,585 B1 | 7/2002 | Ooishi | |
| 6,449,182 B1 | 9/2002 | Ooishi | |
| 6,449,204 B1 | 9/2002 | Arimoto et al. | |
| 6,635,934 B2 * | 10/2003 | Hidaka | ........................ 257/369 |
| 6,670,939 B2 * | 12/2003 | Yang et al. | .................... 345/98 |
| 6,795,328 B2 | 9/2004 | Kato et al. | |

FOREIGN PATENT DOCUMENTS

| | | |
|---|---|---|
| JP | 06-215658 | 3/1996 |
| JP | 08-098859 | 6/1997 |
| JP | 11-314744 | 4/2000 |

* cited by examiner

OTHER PUBLICATIONS

Min, Kyeong-Sik, Kawaguchi, Hiroshi, Sakurai, Takayasu, ZigZag Super Cut-off CMOS (ZSCCMOS) Block Activation with Self-Adaptive Voltage Level Controller: An Alternative to Clock-Gating Scheme in Leakage Dominant Era, 2003 IEEE International Solid-State-Circuits Conference, Feb. 12, 2003,Salon 1-6, pp. 400-401 and 501-502.

*Primary Examiner*—Huan Hoang
(74) *Attorney, Agent, or Firm*—William J. Kubida; Peter J. Meza; Hogan & Hartson LLP

(57) ABSTRACT

A high speed power-gating technique for an integrated circuit device having a Sleep Mode of operation comprises providing an output stage coupled between a supply voltage source and a reference voltage source and driving a gate terminal of least one element of the output stage to a level above that of the supply voltage source or below that of the reference voltage source in the Sleep Mode of operation.

26 Claims, 3 Drawing Sheets

HIGH SPEED POWER-GATING TECHNIQUE FOR INTEGRATED CIRCUIT DEVICES INCORPORATING A SLEEP MODE OF OPERATION

CROSS REFERENCE TO RELATED PATENT APPLICATIONS

The present invention is related to, and claims priority from, U.S. Provisional Patent Application Ser. No. 60/500,126 filed Sep. 4, 2003 for: "0.6V 205 MHz 19.5 nsec TRC 16 Mb Embedded DRAM" the disclosure of which is herein specifically incorporated in its entirety by this reference. The present invention is further related to the subject matter disclosed in U.S. patent applications Ser. No. 10/776,103 entitled: "Sense Amplifier Power-Gating Technique for Integrated Circuit Memory Devices and Those Devices Incorporating Embedded Dynamic Random Access Memory (DRAM)" and Ser. No. 10/776,054 entitled "Column Read Amplifier Power-Gating Technique for Integrated Circuit Memory Devices and Those Devices Incorporating Embedded Dynamic Random Access Memory (DRAM)", the disclosures of which are herein specifically incorporated by this reference in its entirety.

BACKGROUND OF THE INVENTION

The present invention relates, in general, to the field of integrated circuit (IC) devices. More particularly, the present invention relates to a high speed power-gating technique for integrated circuit devices incorporating a Sleep Mode of operation.

Power-gating has been used in conjunction with various circuits to reduce Sleep Mode power. Conventionally, this is achieved by adding transistors in the VCC and VSS supply paths to the circuit. These power gate transistors are turned "on" during an Active Mode of operation and turned "off" during Sleep Mode to reduce the total static current due to transistor "off" current. Typically, the gate terminals of the power gate transistors are forced to higher than VCC (in the case of P-channel devices) or lower than VSS (in the case of N-channel devices) voltage levels so that their voltage gate-to-source ($V_{GS}$) is negative. This reduces the "off" current of these transistors significantly.

However, since there are often a large number of circuits coupled to these power gate transistors, and all of these circuits may be switching at about the same time, the current surge through the power gate transistors during an Active Mode operation ends up being very large. This current surge causes a voltage drop across the power gate transistors which tends to have the same effect as reducing the level of VCC, thereby degrading performance. Furthermore, these power gate transistors must, of necessity, be made extremely large to avoid degrading circuit speed too much, (although such degradation nonetheless occurs to at least some extent) thereby consuming a great deal of on-chip area.

In write data driver circuits associated with integrated circuit memory arrays, this conventional approach is effective if the power-gate transistors can be shared by a significant number of circuits that do not switch at the same time. However, in the case of integrated circuit memory devices and those incorporating embedded memory where there are a large number of write data drivers (for example up to 256 or more) that switch at the same time, the current surge going through the NMOS power-gate transistor is very large. This results in a voltage drop across the power-gate transistor which limits the switching speed of the output stage of the write data driver circuits.

SUMMARY OF THE INVENTION

Disclosed herein is a high speed power-gating technique for integrated circuit devices incorporating a Sleep Mode of operation wherein an output stage is connected directly to VCC and VSS. Instead of connecting a power-gate transistor in series with the output stage as in prior art techniques, the gate of the N-channel output transistor is driven below VSS in Sleep Mode (alternatively, the P-channel transistor can be driven above VCC in Sleep Mode). This has an overall effect which is similar to that of conventional power-gating techniques in that the "off" current through the N-channel device is significantly reduced because its gate-to-source voltage ($V_{GS}$) is negative. In Active Mode, however, the switching speed of the output stage is not impacted, and the preceding stage can be made smaller than that of the output stage (on the order of approximately one third to one fifth the size) and, therefore, the current surge through the power-gate transistors will be small compared to that experienced with conventional power-gating approaches.

Particularly disclosed herein is a power-gating technique for an integrated circuit device having a Sleep Mode of operation comprising providing an output stage coupled between a supply voltage source and a reference voltage source and driving a gate terminal of at least one element of the output stage to a level above that of the supply voltage source or below that of the reference voltage source in the Sleep Mode of operation.

Further disclosed herein is a circuit comprising an output stage including first and second series coupled transistors coupled between a supply voltage source and a reference voltage source with the output stage comprising an input terminal and an output terminal thereof. A power-gating circuit is coupled to a preceding stage of the output stage for applying a voltage level to a gate terminal of the first transistor greater than that of the supply voltage source in response to a Sleep Mode of operation. In an alternative embodiment, the power-gating circuit applies a voltage level to a gate terminal of the second transistor lesser than that of the reference voltage source in response to the Sleep Mode of operation.

Also disclosed herein is an integrated circuit device including a power-gated write data driver circuit for a memory array. The driver circuit comprises at least a first stage coupled between a control node and a power-gated supply voltage line, an output stage coupled between a supply voltage source and the reference voltage source with an input to the output stage being coupled to an output of the at least first stage. A power-gating circuit is coupled to the control node for driving the input of the output stage to a level lower than that of the reference voltage source level in response to a Sleep Mode of operation. In an alternative embodiment, the power-gating circuit may drive the input to a level higher than that of the supply voltage source level in response to the Sleep Mode of operation.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
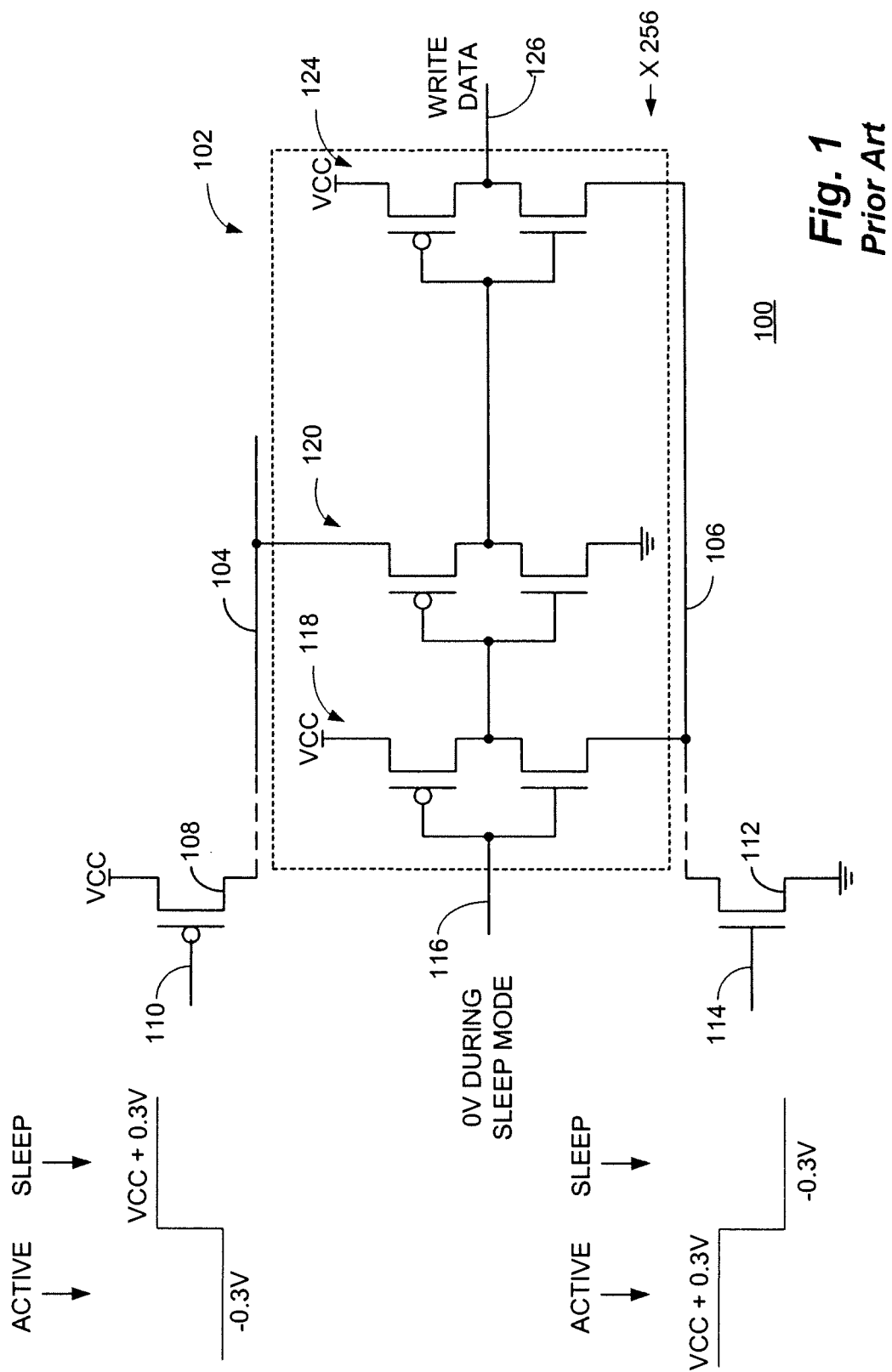
FIG. 1 is a schematic illustration of a conventional power-gating technique employed in a write data driver power-gating circuit in which large P-channel and N-channel power-gating transistors are used to couple and decouple the write data driver to respective VCC and VSS sources in Active and Sleep Modes of operation.

With reference now to FIG. 1, a schematic illustration of a conventional power-gating technique employed in a write data driver power-gating circuit 100 is shown for use in an integrated circuit memory device or other device incorporating embedded memory. The circuit 100 illustrates an exemplary write data driver 102 which may be one of two hundred and fifty six or more such circuits forming a portion of an integrated circuit memory device or embedded memory array.

Each of the write data drivers 102 are coupled to a power-gated supply voltage line 104 and a correspondingly power-gated reference voltage line 106 as shown. The power-gated supply voltage line 104 is selectively coupled and decoupled to a supply voltage line (VCC) through a large P-channel transistor 108 which has its gate terminal 110 coupled to receive an input signal indicative of an Active Mode (−0.3V) and a Sleep Mode (VCC+0.3V) of operation respectively. In like manner, the power-gated reference voltage line 106 is selectively coupled and decoupled to a reference voltage line (VSS) through a similarly large N-channel transistor 112 which has its gate terminal 114 coupled to receive a corresponding input signal indicative of the Active (VCC+0.3V) and Sleep Modes (−0.3V) of operation respectively.

The write data drivers 102 comprise a first inverter stage 118, comprising series connected P-channel and N-channel transistors coupled between VCC and the power-gated reference voltage line 106 having an input 116 which is at 0V during a Sleep Mode of operation. The output of the inverter stage 118 is coupled to the input of another complementary metal oxide semiconductor (CMOS) inverter stage 120 which is coupled between the power-gated supply voltage line 104 and VSS and the output of the inverter stage 120 is coupled to the input of an output stage 124 comprising another CMOS inverter which is coupled between VCC and the power-gated reference voltage line 106 and not VSS directly. The output stage 124 supplies a write data signal on output line 126.

As illustrated, conventional power-gating techniques can be applied to reduce Sleep Mode power in integrated circuit devices. In accordance with the conventional method shown and described, large power-gating transistors 108 and 112 are added between the power-gated circuitry (in this case, write data drivers 102) and the supply voltage source (VCC) and the reference voltage level (VSS or circuit ground). This approach is effective if the power-gate transistors 108, 112 can be shared by a large number of circuits that do not switch at the same time. However, in the case where there are a large number of circuits that switch at the same time, a better power-gating solution is needed.

In those cases, such as the write data drivers 102, wherein the circuitry indicated within the dashed lines are repeated many times, (e.g. 256 times or more) and the output stages 124 all switch at the same time, then the current surge going through the power-gate transistor 112 would be very large. This would result in an effective voltage drop across the power-gate transistor 112 which would limit the switching speed of the output stage 124. Therefore, the power-gate transistor 112 would have to be made very large and the switching speed of the circuit 100 would still be degraded.

Figure 2:
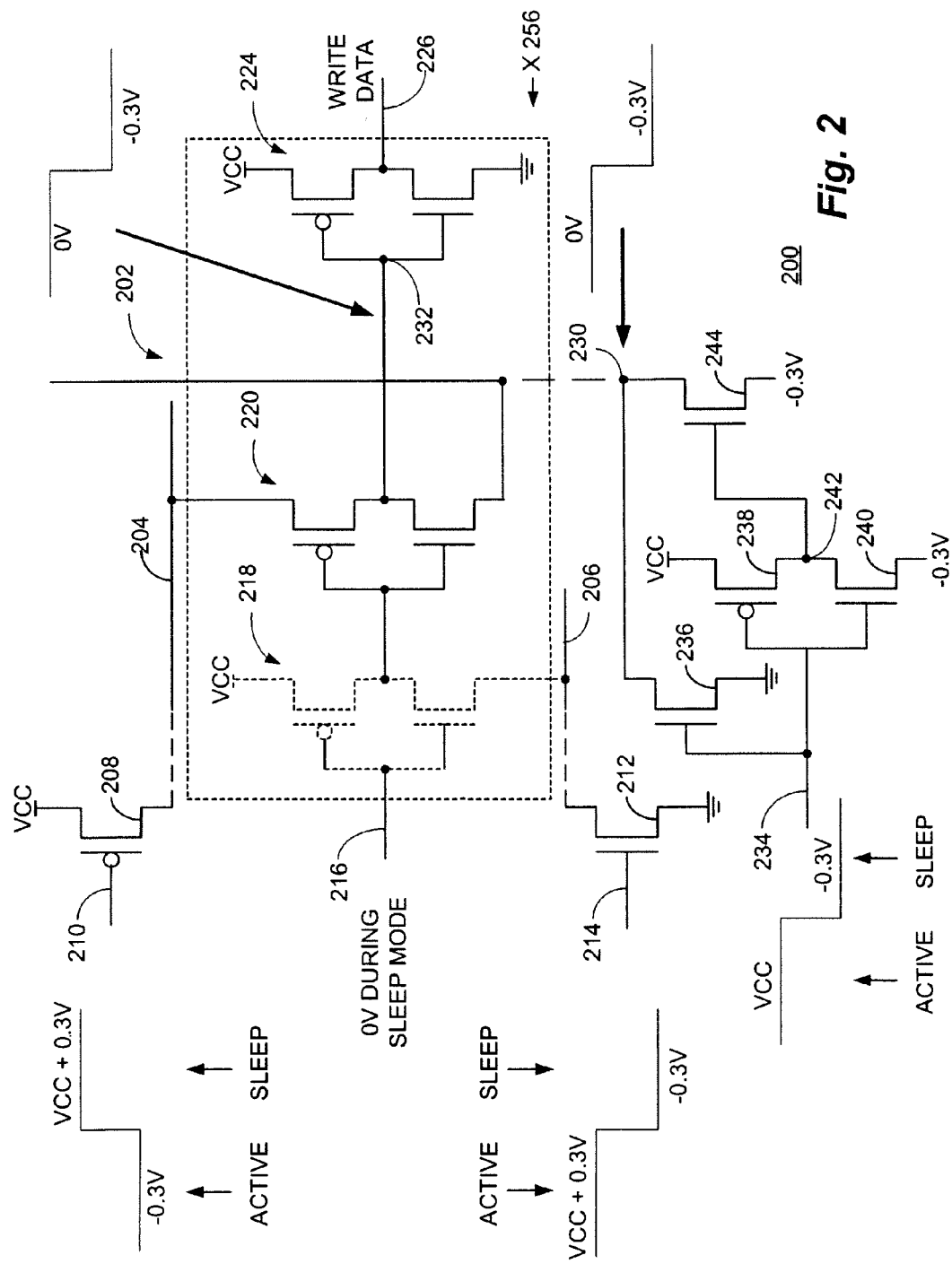
FIG. 2 is a schematic illustration of an exemplary implementation of the high speed power-gating technique of the present invention for use, for example, in a comparable write data driver circuit in which the output stage is coupled directly to VCC and VSS and the gate of the output stage N-channel device is driven below VSS in Sleep Mode.

With reference additionally now to FIG. 2, a schematic illustration of an exemplary implementation of the high speed power-gating technique of the present invention is shown for use, for example, in a comparable write data driver circuit 200 in which the output stage is coupled directly to VCC and VSS and the gate of the output stage N-channel device is driven below VSS in Sleep Mode.

The circuit 200 illustrates an improved, exemplary write data driver 202 which may also be one of two hundred and fifty six or more such circuits forming a portion of an integrated circuit memory device or embedded memory array.

Each of the improved write data drivers 202 are partially coupled to a power-gated supply voltage line 204 and a correspondingly power-gated reference voltage line 206 as shown. The power-gated supply voltage line 204 is selectively coupled and decoupled to VCC through a P-channel transistor 208 which has its gate terminal 210 coupled to receive an input signal indicative of an Active Mode (−0.3V) and a Sleep Mode (VCC+0.3V) of operation respectively. In like manner, the power-gated reference voltage line 206 is selectively coupled and decoupled to VSS through a relatively smaller N-channel transistor 212 (with respect to transistor 112 of FIG. 1) which has its gate terminal 214 coupled to receive a corresponding input signal indicative of the Active (VCC+0.3V) and Sleep Modes (−0.3V) of operation respectively.

The write data drivers 202 comprise a first stage 218, comprising series connected P-channel and N-channel transistors coupled between VCC and the power-gated reference voltage line 206 having an input 216 which is at 0V during a Sleep Mode of operation. The output of the first stage 218 is coupled to the input of another CMOS stage 220 which is coupled between the power-gated supply voltage line 204 and a node 230. The output of the inverter stage 220 at node 232 is coupled to the input of an output stage 224 comprising a CMOS inverter which is directly coupled between VCC VSS. The output stage 224 supplies a write data signal on output line 226.

An Active Mode signal of VCC and corresponding Sleep Mode signal of −0.3V is applied on node 234 coupled to the gate terminal of N-channel transistor 236 which has its drain terminal coupled to node 230 and its source terminal coupled to VSS. Node 234 is also coupled to the gate terminals of series coupled P-channel transistor 238 and N-channel transistor 240 which are coupled between VCC and a source of −0.3V. The node 242 coupled to the drain terminals of transistors 238 and 240 is also coupled to the gate terminal of N-channel transistor 244 which has its drain terminal coupled to node 230 and its source terminal also coupled to a source of −0.3V.

An exemplary implementation of the high speed power-gating technique of the present invention has been shown and described with respect to this figure. In this approach, the output stage 224 is connected directly to VCC and VSS.

Instead of connecting a power-gate transistor (e.g. transistors 208 or 212) in series with the output stage 224, the gate of the N-channel output transistor in the output stage 224 is driven below VSS (e.g. −0.3V) in Sleep Mode. This has the same effect as conventional power-gating in that the "off" current through this N-channel transistor is significantly reduced because its voltage gate-to-source ($V_{GS}$) is negative. In Active Mode, however, the switching speed of the output stage 224 is not impacted, and the preceding stage 220 may be made smaller than the output stage 224 of on the order of approximately one third to one fifth the size. Therefore, the current surge through the power-gate transistor 212 will be relatively small compared to that through transistor 112 in the conventional approach of FIG. 1.

In operation, the write data driver circuit 200 functions as follows. During Active Mode, transistor 236 is turned "on" holding node 230 at VSS (0V). Therefore, node 232 switches between VCC and VSS as the circuit 202 in the dashed lines switches from one logic state to another. In Sleep Mode, transistor 236 is turned "off" and transistor 244 is turned "on". This drives node 230 to a voltage below VSS (−0.3V). Also, during Sleep Mode, the input to the circuit is driven to 0V so that node 232 is driven below VSS. Therefore, the gate of the N-channel transistor in the output stage 224 is held at a voltage below VSS. Since the source of this transistor is connected to VSS, its $V_{GS}$ is negative, which reduces the "off" current through it.

Figure 3:
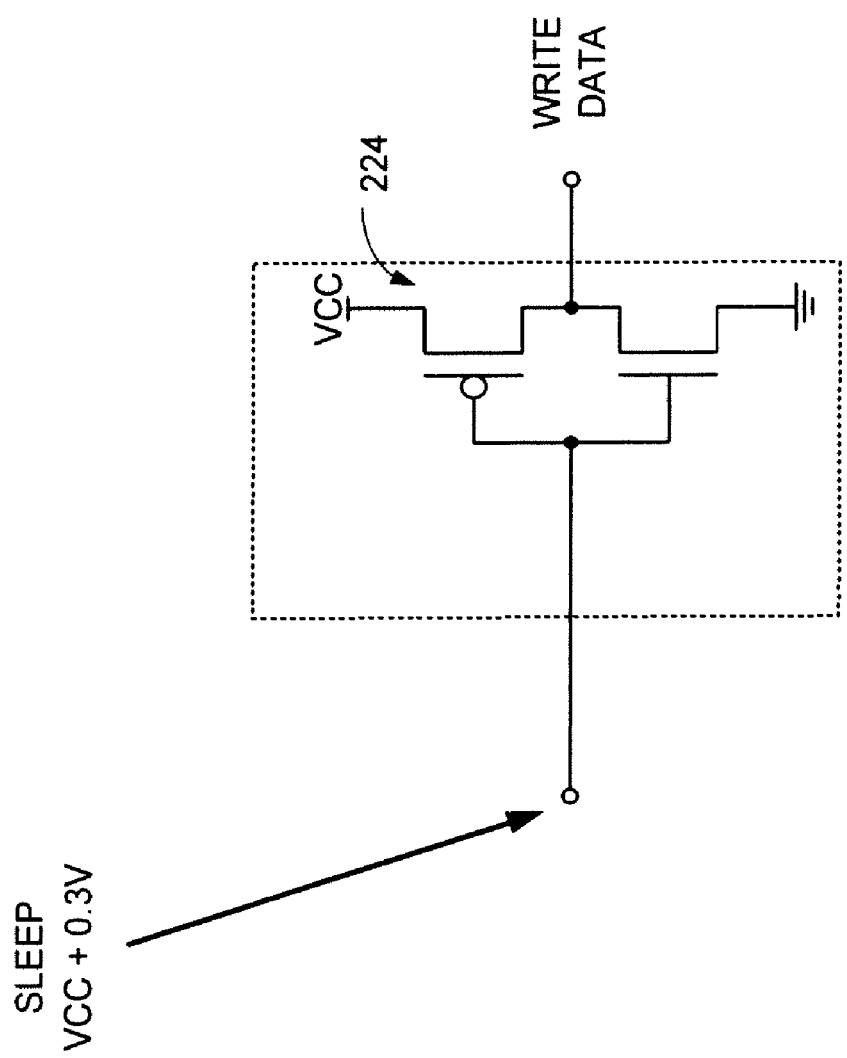
FIG. 3 is a schematic illustration of an output stage for a write data driver circuit in which the output stage is coupled directly to VCC and VSS and the gate of the output stage N-channel device is driven above VCC in a Sleep Mode.

Although, in the representative embodiment shown, the gate of the N-channel transistor of the output stage 224 is shown as being driven below VSS, the principles of the present invention would likewise pertain to those circuit implementations (FIG. 3) wherein the gate of the output P-channel transistor of the output stage 224 were also, or alternatively, driven above VCC (e.g. VCC+0.3V).

While there have been described above the principles of the present invention in conjunction with specific circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A power-gating technique for an integrated circuit device having a Sleep Mode of operation comprising:
   providing an output stage directly coupled between a substantially constant supply voltage source and a substantially constant reference voltage source; and
   driving a gate terminal of at least one element of said output stage to a level above that of said supply voltage source or below that of said reference voltage source in said Sleep Mode of operation.

2. The power-gating technique of claim 1 wherein said output stage comprises series coupled P-channel and N-channel transistors coupled between said supply voltage source and said reference voltage source.

3. The technique of claim 2 wherein said gate terminal of said N-channel transistor is driven below said reference voltage level while in said Sleep Mode of operation.

4. The technique of claim 2 wherein said gate terminal of said P-channel transistor is driven above said supply voltage level while in said Sleep Mode of operation.

5. The technique of claim 1 wherein the output stage comprises two transistors directly coupled to an output terminal of the output stage.

6. A circuit comprising:
   an output stage comprising first and second series coupled transistors directly coupled between a substantially constant supply voltage source and a substantially constant reference voltage source, said output stage comprising an input terminal and an output terminal thereof;
   a power-gating circuit coupled to a stage preceding said output stage for applying a voltage level to a gate terminal of said first transistor greater than that of said supply voltage source in response to a Sleep Mode of operation.

7. The circuit of claim 6 wherein said output stage comprises a CMOS inverter and said first transistor comprises a P-channel transistor.

8. The circuit of claim 6 wherein said voltage level applied to said gate terminal of said first transistor comprises substantially said supply voltage source level plus 0.3V.

9. The circuit of claim 6 wherein the output stage comprises two transistors directly coupled to the output terminal of the output stage.

10. A circuit comprising:
    an output stage comprising first and second series coupled transistors directly coupled between a substantially constant supply voltage source and a substantially constant reference voltage source, said output stage comprising an input terminal and an output terminal thereof;
    a power-gating circuit coupled to a stage preceding said output stage for applying a voltage level to a gate terminal of said second transistor lesser than that of said reference voltage source in response to a Sleep Mode of operation.

11. The circuit of claim 10 wherein said output stage comprises a CMOS inverter and said second transistor comprises a N-channel transistor.

12. The circuit of claim 10 wherein said voltage level applied to said gate terminal of said second transistor comprises substantially said reference voltage source level minus 0.3V.

13. The circuit of claim 10 wherein the two transistors in the output stage are directly coupled to the output terminal of the output stage.

14. An integrated circuit device including a power-gated write data driver circuit for a memory array, said driver circuit comprising:
    at least a first stage coupled between a substantially constant supply voltage source and a power-gated reference voltage line;
    an output stage directly coupled between said supply voltage source and a substantially constant reference voltage source, an input to said output stage being coupled to an output of said at least said first stage; and a power-gating circuit coupled to a stage preceding said output stage for driving said input to a level lower than that of said reference voltage source level in response to a Sleep Mode of operation.

15. The integrated circuit device of claim 14 wherein said output stage comprises a CMOS inverter comprising at least one series coupled P-channel transistor and at least one N-channel transistor.

16. The integrated circuit device of claim 15 wherein a gate terminal of said at least one N-channel transistor is driven to establish a negative $V_{GS}$ in response to said Sleep Mode of operation.

17. The circuit of claim 14 wherein the output stage comprises two transistors directly coupled to an output terminal of the output stage.

18. An integrated circuit device including a power-gated write data driver circuit for a memory array, said driver circuit comprising:

at least a first stage coupled between a substantially constant reference voltage source and a power-gated supply voltage line;

an output stage directly coupled between a substantially constant supply voltage source and said reference voltage source, an input to said output stage being coupled to an output of said at least said first stage; and a power-gating circuit coupled to said input of said output stage for driving said input to a level higher than that of said supply voltage source level in response to a Sleep Mode of operation.

19. The integrated circuit device of claim 18 wherein said output stage comprises a CMOS inverter comprising at least one series coupled P-channel transistor and at least one N-channel transistor.

20. The circuit of claim 18 wherein the output stage comprises two transistors directly coupled to an output terminal of the output stage.

21. A power-gating technique for an integrated circuit device having a Sleep Mode of operation comprising:

providing an output stage directly coupled between a substantially constant supply voltage source and a substantially constant reference voltage source; and driving a common gate terminal of said output stage to a level above that of said supply voltage source in said Sleep Mode of operation.

22. The power-gating technique of claim 21 wherein said output stage comprises series coupled P-channel and N-channel transistors coupled between said supply voltage source and said reference voltage source, and to the common gate terminal.

23. The technique of claim 21 wherein the output stage comprises two transistors directly coupled to an output terminal of the output stage.

24. A power-gating technique for an integrated circuit device having a Sleep Mode of operation comprising:

providing an output stage directly coupled between a substantially constant supply voltage source and a substantially constant reference voltage source; and driving a common gate terminal of said output stage to a level below that of said reference voltage source in said Sleep Mode of operation.

25. The power-gating technique of claim 24 wherein said output stage comprises series coupled P-channel and N-channel transistors coupled between said supply voltage source and said reference voltage source, and to the common gate terminal.

26. The technique of claim 24 wherein the output stage comprises two transistors directly coupled to an output terminal of the output stage.

* * * * *